(12) United States Patent
Huwer et al.

(10) Patent No.: US 8,354,843 B2
(45) Date of Patent: Jan. 15, 2013

(54) MAGNETIC RESONANCE PRE-DETERMINED DATA ACQUISITION AND IMAGE RECONSTRUCTION WITH LOCATION-CODING OF MAGNETIC RESONANCE DATA EXCLUSIVELY VIA PHASE CODING ONLY

(75) Inventors: Stefan Huwer, Erlangen (DE); Josef Pfeuffer, Kunreuth (DE)

(73) Assignee: Siemens Aktiengesellschaft, Munich (DE)

( * ) Notice: Subject to any disclaimer, the term of this patent is extended or adjusted under 35 U.S.C. 154(b) by 540 days.

(21) Appl. No.: 12/559,753

(22) Filed: Sep. 15, 2009

(65) Prior Publication Data

US 2010/0066364 A1 Mar. 18, 2010

(30) Foreign Application Priority Data

Sep. 15, 2008 (DE) .......................... 10 2008 047 218

(51) Int. Cl.
*G01V 3/00* (2006.01)
(52) U.S. Cl. .......................... 324/307; 324/309; 324/318
(58) Field of Classification Search .......... 324/300–322; 600/407–435; 382/128–131
See application file for complete search history.

(56) References Cited

U.S. PATENT DOCUMENTS

| 5,522,390 | A  | * | 6/1996  | Tuithof et al. | 600/410 |
| 6,043,652 | A  | * | 3/2000  | Liu | 324/309 |
| 7,511,489 | B2 | * | 3/2009  | Fautz et al. | 324/307 |
| 7,649,354 | B2 | * | 1/2010  | Bayram et al. | 324/307 |
| 2006/0261810 | A1 | * | 11/2006 | Fautz et al. | 324/309 |
| 2007/0043287 | A1 | * | 2/2007  | Degraaf | 600/410 |
| 2008/0175458 | A1 | * | 7/2008  | Guo et al. | 382/131 |
| 2008/0197842 | A1 |   | 8/2008  | Lustig et al. | 324/307 |
| 2009/0003674 | A1 | * | 1/2009  | Keupp et al. | 382/131 |
| 2009/0082656 | A1 | * | 3/2009  | Bayram et al. | 600/410 |
| 2010/0066364 | A1 | * | 3/2010  | Huwer et al. | 324/309 |

FOREIGN PATENT DOCUMENTS

DE 10 2004 060 513 A1 6/2006

* cited by examiner

*Primary Examiner* — Melissa Koval
*Assistant Examiner* — Tiffany Fetzner
(74) *Attorney, Agent, or Firm* — Schiff Hardin LLP

(57) ABSTRACT

In a method and system to generate magnetic resonance (MR) images by MR data are acquired by a pure phase-coded imaging in k-space having a predetermined set of possible measurement points, with the MR data being acquired only for a predetermined subset of the measurement points of this set. An image is reconstructed from the acquired measurement points of the subset such that information about un-acquired measurement points of the set is also obtained.

19 Claims, 2 Drawing Sheets a)

b)

c)

d)

US 8,354,843 B2

MAGNETIC RESONANCE PRE-DETERMINED DATA ACQUISITION AND IMAGE RECONSTRUCTION WITH LOCATION-CODING OF MAGNETIC RESONANCE DATA EXCLUSIVELY VIA PHASE CODING ONLY

BACKGROUND OF THE INVENTION

1. Field of the Invention

The present invention concerns a method to generate MR images with a magnetic resonance system, wherein only one phase coding is used to code the location of measurement points in the imaging. Moreover, the present invention concerns a correspondingly designed magnetic resonance system.

2. Description of the Prior Art

In an imaging in which pure phase coding schemes are used for spatial coding in two-dimensional or three-dimensional k-space, the measurement time is proportional to the number of measurement points to be detected in two-dimensional or three-dimensional k-space, such that the measurement time depends in the two-dimensional case on the product $N_x * N_y *$ TR and in the three-dimensional case on the product $N_x * N_y * N_z *$ TR. $N_x$ and $N_y$ and $N_z$ describe the edge length of k-space in measurement points along the x-axis, the y-axis and the z-axis, respectively. The repetition time ("Time to Repetition") or measurement time per measurement point to be acquired is specified with TR. Even with a very short TR of 10 ms, a total measurement time of 44 minutes is required for k-space of 64* 64* 64 measurement points to be acquired, and 5.5 minutes are required even given k-space of 32* 32* 32 measurement points to be acquired. Therefore only very small measurement spaces (k-spaces) are typically selected in the imaging of a living subject (for example a patient) in the prior art, or only a low spatial resolution is used.

SUMMARY OF THE INVENTION

An object of the present invention is to provide a method that operates with a pure, spatially phase-coded imaging but still significantly reduces the total measurement time in comparison with the prior art.

The above object is achieved in accordance with the invention by a method to generate MR images using a magnetic resonance system, the method including acquisition of MR data by imaging in k-space composed of a predetermined set of measurement points (occupiable data entry locations). Only a portion of this predetermined set of measurement points is acquired or sampled, and the coding of the location in the imaging ensues only by a phase coding (and not with a frequency coding). An image is reconstructed (in particular by the method of compressed sampling) from the acquired measurement points of this portion (the subset of the acquired measurement points), with information about measurement points that are not acquired is also being represented in the image as a result of this reconstruction.

The number of measurement points to be acquired in k-space is thereby reduced, whereby the total measurement time can also be correspondingly reduced. It has been shown experimentally that it is sufficient when the measurement points of the subset comprise only 20% of the actual measurement points potentially located in k-space, such that the total measurement time can be reduced by a factor of 5 in comparison to methods according to the prior art.

As used herein, the phrase "imaging in which the coding of the location ensues exclusively by a phase coding," means that location information of the MR data of the measurement points in k-space is determined (in addition to the B0 field and the radio-frequency pulses) with only phase coding gradients and not with frequency coding gradients. According to the invention, a frequency coding can be used to code any information except for the location information. For example, the frequency coding can be used to code spectral information.

Compressed sampling ("compressed sensing") is a statistical technique for data acquisition and data estimation which is aimed at acquiring or sampling only relatively few measurement points in a measurement region (here in k-space). In spite of this, these measurement values sparsely acquired in k-space can, under certain conditions, reproduce nearly the complete information which—without the compressed sampling—can be reconstructed only via an acquisition of all measurement points in k-space.

In compressed sampling, the connection between the acquired measurement points in k-space and the corresponding pixels in image space is provided via an association $\psi$ between image space and k-space and a Fourier transformation $\phi$ given undersampling which corresponds to undersampling in k-space. The image reconstruction via the compressed sampling can therefore be expressed by the following optimization problem:

(I) Minimize $\|\psi m\|_1$ (II) and simultaneously optimize $\|\phi m - y\|_2 < \epsilon$ wherein y is the measured MR data in k-space, m is the reconstructed image, $\epsilon$ is a threshold, $\| \|_1$ is the L1 norm and $\| \|_2$ is the L2 norm.

The number of actual sampled measurement points in k-space is reduced via the condition I relative to all measurement points presented in k-space, all of which would be acquired by conventional imaging methods. In contrast to this, the condition II reinforces the consistency between the reconstructed data and the acquired MR data. The method of compressed sampling was developed by Emmanuel Candes and Terence Tao.

If a conventional fast Fourier transformation were used in order to reconstruct a corresponding image starting from an incompletely sampled data set in k-space, this image would exhibit numerous artifacts distorting the image in comparison with a reconstruction according to the invention with the compressed sampling.

The optimization problem cited above in the description of the compressed sampling can be solved in various ways within the scope of the present invention. For example, the reconstruction of the image can ensue with the incorporation of additional boundary conditions while maintaining both of the aforementioned conditions I and II.

The methods for image reconstruction that are used in the compressed sampling typically operate iteratively, wherein optimization methods such as "conjugate gradient descent" are used, for example. Methods such as wavelets or discrete cosine transformation (DCT) can thereby be used in order to arrive at transformed, "compressed" k-space via which the optimization is then conducted. These methods serve to optimize the subset of the actual measurement points to be acquired in k-space. Other transformation methods (such as code books, Gabor filtering) can likewise be used.

The present invention can in particular be used in a single point imaging (SPI). The MR data in k-space are acquired by a single point imaging in which normally only one measurement point is acquired per phase coding step. In this case, in the single point imaging a short, rectangular radio-frequency pulse is generated for excitation and a single measurement point in k-space is scanned directly after this excitation, in particular in that the free induction signal is detected. Due to the short echo time and the direct or pure phase coding for position coding, the single point imaging is nearly unaffected by inhomogeneities of the B0 field, by variations of the magnetic susceptibility and by artifacts of chemical shifting. The single point imaging is used for materials and nuclei with short T1 and/or T2 times, for example porous materials or bones.

According to the invention, the single point imaging should thereby also comprise what is known as an improved single point imaging. In improved single point imaging, the free induction signal is sampled repeatedly at successive, identical time intervals, with multiple measurement points in k-space being acquired without the radio-frequency pulse being re-generated to acquire each of these measurement points, for example, as is the case in the "pure" single point imaging described in the preceding.

In the case of medical application, the single point imaging can be used in the following cases:
- to acquire $^1H$ signals, for example of a spine, a knee, a cartilage or plaque,
- to acquire $^{23}Na$ signals given use within the scope of a stroke,
- to acquire $^{17}O$ signals of oxygen marked with $^{17}O$ and water in order to measure a blood flow (rCBF; "regional Cerebral Blood Flow") and an oxygen consumption rate (CMR02; "Cerebral Metabolic Rate Oxygen").

Since the radio-frequency excitation ensues globally in single point imaging and cannot be locally limited, a three-dimensional phase coding (all three spatial directions must be coded) is necessary.

According to the invention, it is naturally also possible to use specific varieties of single point imaging (SPI), for example the SPRITE method (SPRITE ("single-point ramped imaging with T1 enhancement")), see. Gravina-S, Cory-DG, JMR 104 (1994) 53-61 or Balcom-BJ et al., JMR 123 (1996) 131.

Another possibility is to use the present invention in MR spectroscopy (MRSI ("Magnetic Resonance Spectroscopic Imaging"). In MR spectroscopy, the physical correlations known from magnetic resonance tomography are used in order to detect the chemical state within a body.

MR spectroscopy can be used with the present invention, for example to detect a $^1H$ signal of a metabolite (for example creatine or lactate), although the metabolite concentration to be measured is 4 orders of magnitude smaller than in the imaging of water (1-10 mM compared with 55 M). Therefore, according to the prior art only low spatial resolutions or low signal-to-noise ratios are achieved in this case due to the high requirements for the measurement speed in MR spectroscopy, which can be distinctly improved by the present invention in that the measurement time is reduced by a factor of 5 given the same measurement quality, or in that the acquisition quality (spatial resolution, signal-to-noise ratio) is correspondingly improved given the same measurement time.

The choice of which of the potential measurement points in k-space are actually acquired via the method according to the invention can thereby ensue at random, such that the result of the acquired measurement points in k-space yields a random distribution of these measurement points in k-space. However, according to the invention it is also possible that the acquired measurement points in k-space are distributed uniformly or corresponding to a predetermined pattern. A three-dimensional sampling scheme or a sampling rule is typically used with which the measurement points to be scanned according to the invention are determined in three-dimensional k-space. However, according to the invention it is also possible to use one-dimensional or two-dimensional scanning rules, wherein the two-dimensional scanning rule specifies the measurement points to be scanned in a slice of k-space and the one-dimensional scanning rule specifies the measurement points to be scanned in one row of a slice of k-space.

Instead of the uniform distribution of the measurement points to be acquired in k-space, the distribution of the measurement points in k-space can also be designed to be non-uniform or variable, which positively affects the point response or, respectively, point spread function (PSF) in the resolution of the image to be reconstructed, and therefore positively affects the image quality. For example, the variable distribution of the measurement points can ensue in k-space such that the measurement points of the subset (i.e. the actual measurement points acquired in k-space) exhibit a higher density in proximity to the center of k-space than in the remainder of k-space or, respectively, at the edge of k-space. More measurement points are therefore acquired in the middle or in the center of k-space than in the outside of k-space.

According to a further embodiment according to the invention, selected measurement points in k-space can be measured multiple times. The point response can likewise be improved with such an acquisition-weighted scanning rule.

The measurement points in k-space can be measured with different frequency and therefore can be averaged. In particular, the measurement points in the center of k-space can be averaged more often (for example 5 times) than the measurement points at the edge of k-space (for example 1 time). A k-space filter which defines an acquisition weighting is created through this type of recording or acquisition of the MR data. Such a method saves time in comparison with a method in which all measurement points in k-space are measured just as often since fewer weighted measurement points in k-space are measured less often.

To implement the method according to the invention, k-space can be divided into multiple sections. The measurement points to be scanned according to the method are thereby acquired in a corresponding section, and the reconstruction of the image or of the information for the measurement points acquired in this section is already begun while the measurement points determined according to the invention are simultaneously acquired in a second section etc.

Since measurement points are acquired and the image is simultaneously reconstructed from measurement points that have already been acquired, a parallel acquisition of the measurement points and reconstruction of the image is achieved, so the total time to generate the image can be additionally decreased.

The above object also is achieved in accordance with the present invention by a magnetic resonance system that generates MR images. The magnetic resonance system has a control unit that controls a magnetic resonance data acquisition unit, a receiver device to receive signals acquired by the scanner, and an evaluation device that evaluates the signals and to generate MR images. The magnetic resonance system is designed such that the magnetic resonance system acquires MR data in k-space the data being a predetermined set of potential measurement points only for a portion of these potential measurement points by means of a pure phase coding. From the acquired measurement points, the magnetic resonance system reconstructs such an image (together with spectral information of the corresponding pixels) with the evaluation device so that information about the un-acquired measurement points in k-space are also acquired.

The magnetic resonance system according to the invention has advantages that essentially correspond to those described above in connection with the method according to the invention.

The present invention encompasses a computer-readable medium encoded with programming instructions a software), which can be loaded into a memory of a programmable controller or a computer of a magnetic resonance system. The embodiments of the method according to the invention can be executed according to the programming instructions with the software running in the controller. The programming instructions embody routines and units (for example libraries and auxiliary functions) in order to realize the corresponding embodiments of the method. The software can thereby be in the form of a source code (for example in C++) that must still be compiled and linked or, or an executable software code that just has to be loaded into the appropriate computer for execution.

The electronically readable data medium (for example a DVD or CD-ROM) stores electronically readable control information (the software).

In the present invention, the information which is present in un-acquired measurement points in k-space is effectively replaced through the manner in which the image is reconstructed, in particular by means of compressed sampling. The advantage of the time savings achieved according to the invention during the acquisition of the MR data due to the reduced number of measurement points acquired in k-space is thus somewhat offset in the reconstruction step in which the image is reconstructed from the MR data. Although the reconstruction needs a longer (in comparison to the prior art) processing time for the acquired MR data to reconstruct the image, this entails effectively no disadvantage due to the processing power available today. Overall, a shorter residence time in a magnetic resonance system results for the patient in comparison with conventional methods and systems, for a corresponding examination.

The present invention is in particular suitable to generate MR images (including chemical information when appropriate) of the inside of the body of a patient using a magnetic resonance system. Naturally, the present invention is not limited to this preferred application field but also can be used to examine the chemical composition of inanimate objects, for example.

DESCRIPTION OF THE PREFERRED EMBODIMENTS

Figure 1:
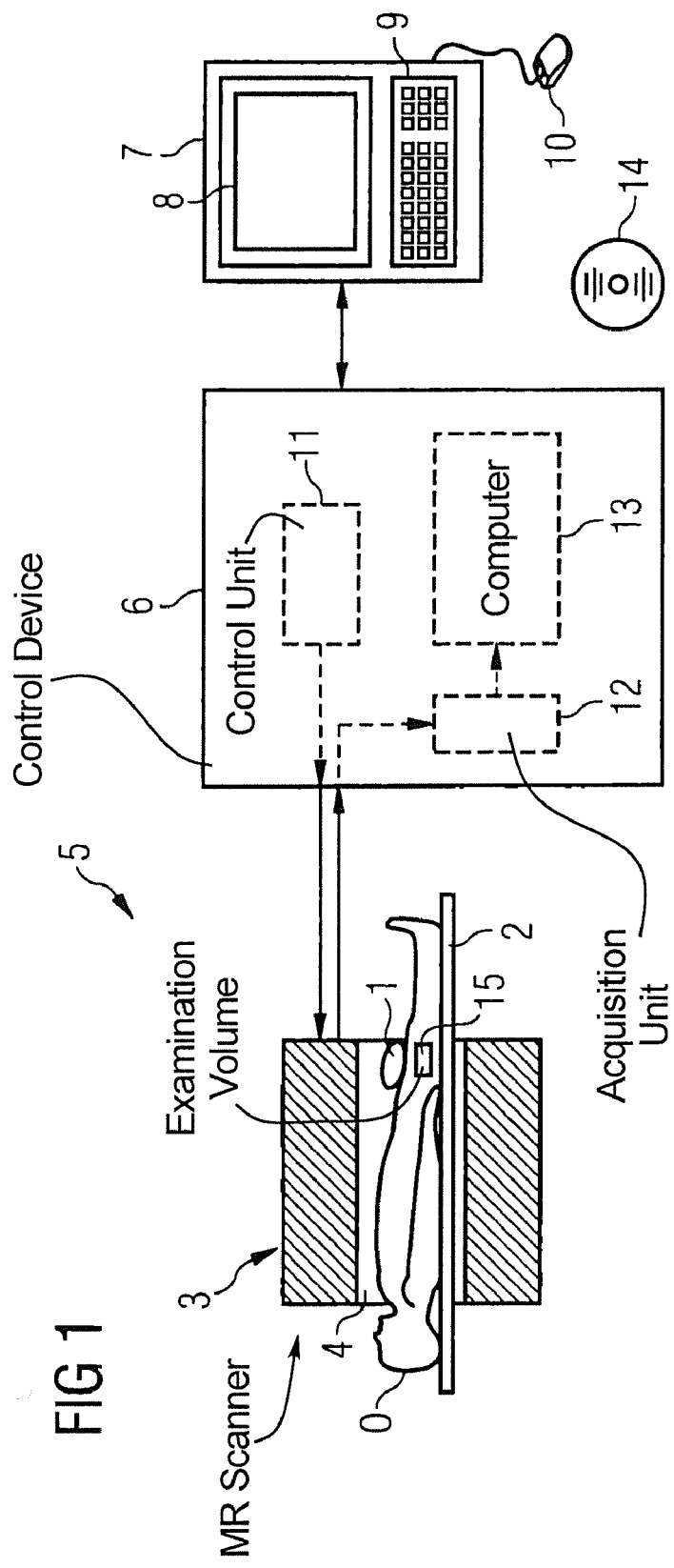
FIG. 1 schematically shows a magnetic resonance system according to the invention.

The magnetic resonance (MR) system 5 according to the invention is schematically illustrated in FIG. 1. The magnetic resonance system 5 essentially has a scanner 9MR data acquisition unit) 3 with which the magnetic field necessary for the MR examination is generated in a measurement chamber 4, a table 2, a control device 6 with which the scanner 3 is controlled and MR data from the scanner 3 are recorded (acquired), and a terminal (console) 7 connected to the control device 6.

The control device 6 includes a control unit 11, an acquisition unit 12 and an evaluation device 13. During an MR examination, MR data are acquired by the acquisition unit 12 with the scanner 3, the scanner 3 being controlled for this purpose by the control unit 11 such that only a specific portion of all possible measurement points is acquired within a measurement volume 15 (located inside the body of a patient O situated on the table 2). The set of all possible measurement points in the measurement volume 15 corresponds to k-space. The evaluation device 13 then reconstructs an image from the acquired MR data by the technique of compressed scanning.

This image can be presented on a screen 8 of the terminal 7. In addition to the presentation of the image, the scanning rule that will be used to scan the measurement points measured (acquired) in k-space can be predetermined by a user via the terminal 7. The terminal 7, in addition to the screen 8, has a keyboard 9 and a mouse 10. The software for the control device 6 can also be loaded through the terminal 7 into the control device 6 (in particular into the computer 13). This software of the control device 6 embodies the method according to the invention for the generation of MR images, and can likewise be stored on a DVD 14 so that this software can then be read by the terminal 7 from the DVD 14 and be copied into the control device 6.

Figure 2:
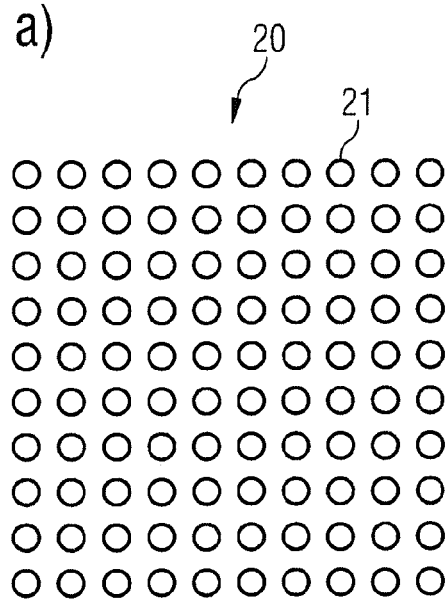
FIG. 2 shows various scanning rules according to the invention.
Figure 2:
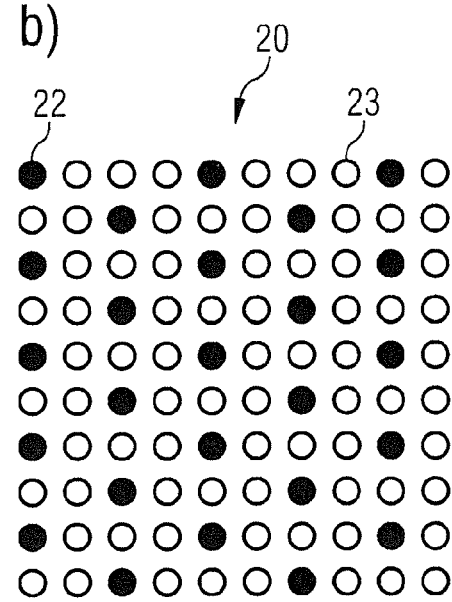
Figure 2:
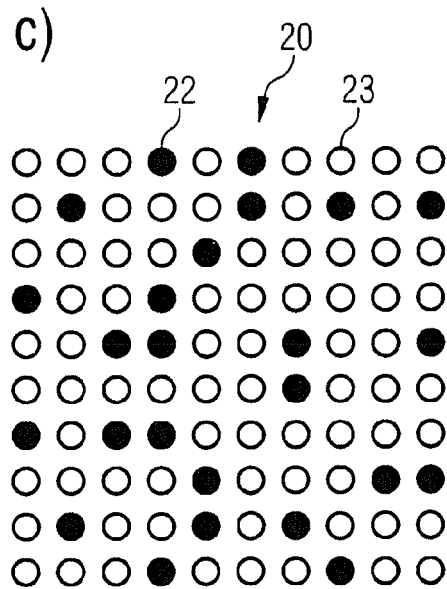
Figure 2:
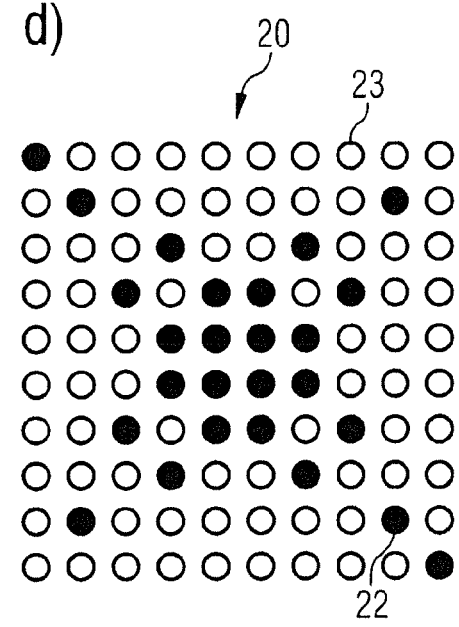

Various scanning rules according to the invention are schematically described in FIG. 2. In part (a) of FIG. 2, all potential measurement points 21 of two-dimensional k-space 20 are shown. In a single point imaging method (SPI method) according to the prior art, all of these 100 measurement points 21 would be acquired.

In contrast to this, in the method according to the invention substantially fewer measurement points are acquired, but according to the invention there are multiple possibilities to determine those measurement points 22 that are acquired by means of a pure phase-coded acquisition. For example, in part (b) of FIG. 2 a uniform scanning rule is shown in which every fourth measurement point 21 is scanned or acquired. The scanning rule shown in part (b) FIG. 2 begins with the measurement point at the top left and proceeds line by line from left to right, and continues from the right end of one line to the left end of the line situated below. Those measurement points that are not acquired or scanned are indicated with the reference character 23 in FIG. 2.

In contrast to this, part (c) of FIG. 2 shows a scanning rule in which the measurement points 22 to be acquired are selected randomly from the set of all measurement points 21. In part 9d) of FIG. 2, a scanning rule is shown in which measurement points in proximity to the center of k-space 20 are scanned more frequently than at the edge of k-space 20, such that the acquired measurement points 22 in proximity to the k-space center exhibit a higher density than in the rest of k-space 20. In general, a distribution pattern ("pattern based") can be used with which the measurement points 22 to be acquired are determined, with a central scan (see part (d) of FIG. 2) is an example of this. The density of this distribution pattern can be distributed uniformly or non-uniformly (variably) in k-space, so a non-uniform distribution is also designated as a variable density.

With regard to the scanning rules shown in FIG. 2, it is noted that these are line- and column-oriented for presentational reasons, but the method according to the invention naturally also encompasses other (for example spiral-shaped) scanning rules (trajectories). Moreover, the scanning rules shown in FIG. 2 are limited to two-dimensional scanning rules, while the present invention also encompasses one-dimensional, three-dimensional and four-dimensional scanning rules. The spectral information of a point is thereby considered as the fourth dimension.

Although modifications and changes may be suggested by those skilled in the art, it is the intention of the inventors to

We claim as our invention:

1. A method for generating a magnetic resonance image, comprising the steps of:
   providing a k-space memory comprising a predetermined set of measurement points respectively occupiable by data entries;
   with a magnetic resonance data acquisition unit, acquiring magnetic resonance data from an examination volume of a subject only for a predetermined subset of said measurement points in said predetermined set, and only location-coding said acquired magnetic resonance data exclusively with a phase coding;
   entering said acquired magnetic resonance data into said k-space memory, thereby resulting in said k-space memory comprising
      occupied measurement points corresponding to said measurement points in said subset, and
      unoccupied measurement points corresponding to other points of the predetermined set of measurement points and not in said acquired subset;
   in a computer,
      reconstructing an image from said occupied measurement points
   in k-space using an image reconstruction technique that causes said image to also contain information about said measurement volume corresponding to said unoccupied measurement points; and
      making said reconstructed image available as a data file at an output of said computer.

2. A method as claimed in claim 1 comprising employing a compressed sampling technique as said image reconstruction technique.

3. A method as claimed in claim 1 comprising acquiring said magnetic resonance data by single point imaging.

4. A method as claimed in claim 1 comprising randomly selecting said measurement points in said subset of k-space from said measurement points of said predetermined set.

5. A method as claimed in claim 1 comprising employing measurement points that are uniformly distributed in said k-space memory as said predetermined measurement points in said subset.

6. A method as claimed in claim 1 comprising employing measurement points that are variably distributed in said k-space memory as said predetermined measurement points in said subset.

7. A method as claimed in claim 1 comprising repeatedly acquiring selected measurement points in said subset when acquiring said magnetic resonance data with said magnetic resonance data acquisition unit.

8. A method as claimed in claim 1 comprising:
   dividing said occupiable locations in said k-space memory into a plurality of sections;
   acquiring said measurement points in said predetermined subset in a first of said plurality of sections;
   and reconstructing said image from the measurement points in said first of said plurality of sections while simultaneously acquiring said measurement points of said subset for a second of said plurality of sections.

9. A method as claimed in claim 1 comprising:
   acquiring magnetic resonance spectroscopic data as said magnetic resonance data with said magnetic resonance data acquisition unit; and
   reconstructing said image together with spectral information from said measurement points in said predetermined subset of k-space with said spectral information also including spectral information about said examination volume corresponding to said unoccupied measurement points of said predetermined set.

10. A magnetic resonance system configured for generating a magnetic resonance image, comprising:
    a magnetic resonance data acquisition unit configured to interact with an examination subject;
    a k-space memory comprising a predetermined set of measurement points respectively occupiable by data entries;
    a control computer configured to operate said magnetic resonance data acquisition unit in order to acquire magnetic resonance data from an examination volume of a subject only for a predetermined subset of said measurement points in said predetermined set, and in order to only location-code said acquired magnetic resonance data exclusively with a phase coding;
    said control computer being configured to enter said acquired magnetic resonance data into said k-space memory, thereby resulting in said k- space memory comprising occupied measurement points corresponding to said measurement points in said subset, and unoccupied measurement points corresponding to other points of the predetermined set of measurement points and not in said acquired subset; and
    an image computer configured to reconstruct an image from said occupied measurement points in k-space using an image reconstruction technique that causes said image to also contain information about said measurement volume corresponding to said unoccupied measurement points, and configured to make said reconstructed image available as a data file at an output of said image computer.

11. A magnetic resonance system as claimed in claim 10 wherein said image computer is configured to employ a compressed sampling technique as said image reconstruction technique.

12. A magnetic resonance system as claimed in claim 10 wherein said control computer is configured to operate said magnetic data acquisition unit in order to acquire said magnetic resonance data by single point imaging.

13. A magnetic resonance system as claimed in claim 10 wherein said control computer is configured to randomly select said measurement points in said subset of k-space from said measurement points of said predetermined set.

14. A magnetic resonance system as claimed in claim 10 wherein said control computer is configured to employ measurement points that are uniformly distributed in said k-space memory as said predetermined measurement points in said subset.

15. A magnetic resonance system as claimed in claim 10 wherein said control computer is configured to employ measurement points that are variably distributed in said k-space memory as said predetermined measurement points in said subset.

16. A magnetic resonance system as claimed in claim 10 wherein said control computer is configured to operate said magnetic data acquisition unit in order to repeatedly acquire selected measurement points in said subset when acquiring said magnetic resonance data.

17. A magnetic resonance system as claimed in claim 10
    wherein said occupiable locations in said k-space memory are divided into a plurality of sections, and
    wherein said control computer is configured to operate said magnetic data acquisition unit in order to acquire said measurement points in said predetermined subset in a first of said plurality of sections, and wherein said image computer is configured to reconstruct said image from the measurement points in said first of said plurality of sections while simultaneously acquiring said measurement points of said subset for a second of said plurality of sections.

18. A magnetic resonance system as claimed in claim 10
wherein said control computer is configured to operate said magnetic data acquisition unit in order to acquire magnetic resonance spectroscopic data as said magnetic resonance data, and
wherein said image computer is configured to reconstruct said image together with spectral information from said measurement points in said predetermined subset of k-space with said spectral information also including spectral information about said examination volume corresponding to said unoccupied measurement points of said predetermined set.

19. A non-transitory, computer-readable medium encoded with programming instructions for generating a magnetic resonance image for use with a k-space memory comprising a predetermined set of measurement points respectively occupiable by data entries, said programming instructions, when said medium is loaded into a magnetic resonance apparatus, causing the computer system to:

operate a magnetic resonance data acquisition unit of the apparatus, in order to acquire magnetic resonance data from an examination volume of a subject only for a predetermined subset of said measurement points in said predetermined set, and only location-code said acquired magnetic resonance data exclusively with a phase coding;

enter said acquired magnetic resonance data into said k-space memory, thereby resulting in said k-space memory comprising
  occupied measurement points corresponding to said measurement points in said subset, and
  unoccupied measurement points corresponding to other points of the predetermined set of measurement points and not in said acquired subset;

reconstruct an image from said occupied measurement points in k-space using an image reconstruction technique that causes said image to also contain information about said measurement volume corresponding to said unoccupied measurement points; and make said reconstructed image available as a data file at an output of said computer system.

* * * * *